United States Patent
Yu et al.

(10) Patent No.: US 6,927,162 B1
(45) Date of Patent: Aug. 9, 2005

(54) METHOD OF FORMING A CONTACT IN A SEMICONDUCTOR DEVICE WITH FORMATION OF SILICIDE PRIOR TO PLASMA TREATMENT

(75) Inventors: Wen Yu, Fremont, CA (US); Jinsong Yin, Sunnyvale, CA (US); Connie Pin-Chin Wang, Menlo Park, CA (US); Paul Besser, Sunnyvale, CA (US); Keizaburo Yoshie, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/782,874

(22) Filed: Feb. 23, 2004

(51) Int. Cl.$^7$ .................... H01L 21/4763; H01L 21/44
(52) U.S. Cl. .................... 438/637; 438/644; 438/648; 438/649; 438/675
(58) Field of Search .................... 438/637, 644, 438/648, 649, 675

(56) References Cited

U.S. PATENT DOCUMENTS

2003/0072884 A1 * 4/2003 Zhang et al. .......... 427/255.391
2003/0194859 A1   10/2003 Huang .......................... 438/652

* cited by examiner

*Primary Examiner*—William M. Brewster

(57) ABSTRACT

A method of forming a contact in a semiconductor device deposits a refractory metal contact layer in a contact hole on a conductive region portion in a silicon substrate. The refractory metal contact layer is reacted with the silicide region prior to a plasma treatment of a contact barrier metal layer formed within the contact hole. This prevents portions of the refractory metal contact layer from being nitridated prior to conversion to silicide.

19 Claims, 3 Drawing Sheets

US 6,927,162 B1

METHOD OF FORMING A CONTACT IN A SEMICONDUCTOR DEVICE WITH FORMATION OF SILICIDE PRIOR TO PLASMA TREATMENT

FIELD OF THE INVENTION

The present invention relates to the field of semiconductor processing, and more particularly, to the formation of contacts in a metallization process.

BACKGROUND OF THE INVENTION

Integrated circuits are manufactured as assemblies of various devices, such as transistors that make up a chip. In the process of manufacturing integrated circuits, after the individual devices, such as transistors, have been fabricated in the silicon substrate, the devices must be connected together to perform the desired circuit functions. This connection process is generally referred to as "metallization", and is performed using a number of different photolithographic and deposition techniques.

Contact plugs are employed to make a solid connection between an underlying device, for example, and an overlying interconnection conductive line, for example. The fabrication of a contact typically involves forming an opening in the dielectric layer and filling the opening with a metallic layer, such as aluminum or tungsten. However, aluminum or tungsten ions from the contact can migrate into a silicon substrate through a doped region, causing a short to the substrate. To minimize this shorting, many processing techniques deposit a barrier layer before depositing the aluminum or tungsten. One type of common barrier material is titanium nitride (TiN). While titanium nitride has a good barrier ability, it needs to be thick enough to effectively function as a barrier layer. As integrated circuit devices are defined more finely, the diameter of the contact shrinks and becomes more critical. Thus, a thick titanium nitride barrier metal layer is less desirable in more highly integrated circuits.

It has been found that increasing the nitride in titanium nitride improves its barrier effect. One approach is to implant nitrogen into titanium nitride in order to increase the barrier effect and reduce the thickness of the titanium nitride barrier metal layer in order to meet the highly integrated structure requirement. One method for implanting the nitrogen into titanium nitride is to perform a nitrogen plasma treatment in an atmosphere of hydrogen gas.

Another commonly used barrier layer is formed from metal organic CVD titanium nitride (MOCVD-TiN). Inherently, the MOCVD-TiN material contains impurities such as carbon and oxides, so that the resistance of MOCVD-TiN material is high. In order to reduce the resistance, one method removes these impurities by treating the barrier layer with a plasma gas containing an atmosphere of nitrogen. However, following the plasma gas treatment, the thickness of the MOCVD-TiN is substantially reduced. Consequently, the treated MOCVD-TiN layer thus formed has comparatively lower resistance, but the thickness is not adequate to function as a barrier layer effectively.

The effectiveness of the contact is limited by the contact resistance between the barrier metal layer and the doped regions in the substrate. Contact resistance is of particular concern in CMOS (complementary metal-oxide-silicon) technology. One approach to reduce the contact resistance is to deposit a conformal refractory metal layer into the opening, deposit the barrier metal on the refractory metal layer, and then perform a thermal process to effect a reaction between the metal and the silicon atoms of the substrate to form metal silicide. Since the metal silicide has a low resistance, consequently the contact resistance can be reduced.

One of the concerns of this methodology is that the plasma treatment to condense or reduce contaminants in the MOCVD-TiN layer affects the contact metal (titanium) underneath, especially in the case when titanium silicide formation is required for low contact resistance to the silicon substrate. This is due to portions of the titanium being easily converted to titanium nitride prior to being converted to titanium silicide in a subsequent rapid thermal anneal (RTA) step. The conversion of portions of the titanium to titanium nitride causes degradation of the contact resistance and distribution. Furthermore, in order to provide adequate titanium to form silicide, and compensate for the conversion of a portion of the titanium to titanium nitride, an excessive amount of titanium needs to be initially deposited. However, this raises concerns regarding overhang on the contact opening, as well as requiring additional titanium material for the process.

SUMMARY OF THE INVENTION

There is a need for an improved method of forming contacts in a semiconductor device that allows plasma treatment of a contact barrier metal layer, but still allows for the formation of silicide.

This and other needs are met by embodiments of the present invention which provide a method of forming a contact in a semiconductor device comprising the steps of forming a silicon substrate with a conductive region, and forming a dielectric layer on the silicon substrate and a contact hole in the dielectric layer exposing at least a portion of the conductive region. A refractory metal contact layer is deposited in the contact hole and on the conductive region portion. A silicide region is formed by reacting the refractory metal contact layer with a conductive region portion. A contact barrier metal layer is formed on the refractory metal contact layer. The contact barrier metal layer is plasma treated only after the forming of the silicide region.

Since the refractory metal in the contact layer is already consumed by the silicon before the plasma treatment, the effective thickness of the refractory metal layer at the bottom of the contact hole is thicker than in a conventional process. Hence, a thinner layer of the refractory metal may be employed, saving on material, reducing overhang and better extending the technology.

The earlier stated needs are also met by other embodiments of the present invention which provide a method of forming a contact, comprising the steps of depositing a refractory metal contact layer within a contact hole formed in a dielectric layer on a silicon substrate having a contact region exposed by the contact hole. A contact barrier metal layer is formed on there refractory metal contact layer, and silicide is subsequently formed at the contact region. After forming silicide, a nitrogen plasma treatment is performed.

In other embodiments of the invention, the contact barrier metal layer is formed on the contact metal layer prior to the formation of silicide. However, the silicide is formed before the contact barrier metal layer is subjected to a plasma treatment. This prevents the premature nitridation of the contact metal layer prior to the formation of silicide.

The foregoing and other features, aspects and advantages of the present invention will become more apparent from the

DETAILED DESCRIPTION OF THE INVENTION

The present invention addresses and solves problems related to the formation of a contact in a semiconductor device, and particularly to problems arising from the plasma treatment provided to contact barrier metal layers and its effect on the contact metal underneath the barrier metal. This is achieved by the present invention, in part, by the formation of a silicide with a refractory metal contact layer and the conductive region of the substrate, prior to the formation of the contact barrier metal layer. In other embodiments, the contact barrier metal layer is formed on the contact metal, but the plasma treatment is not performed until after formation of the silicide. Hence, when the plasma treatment is performed on the contact barrier metal layer, the titanium silicide has already been formed. This prevents the titanium in the contact metal layer from being prematurely converted to titanium nitride before being able to be converted to titanium silicide.

Figure 1:
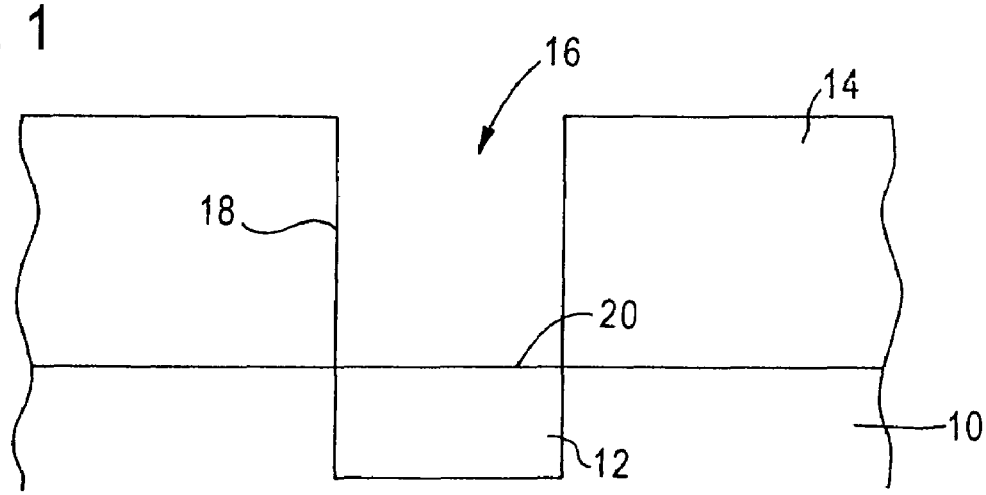
FIG. 1 is a schematic, cross-sectional view of a contact area drawing one step of manufacture in accordance with embodiments of the present invention.

FIG. 1 is a schematic, cross-sectional view of the contact area of a semiconductor device during one phase of manufacture. A silicon substrate 10 has a contact region 12 formed therein. The contact region 12, or conductive region portion 12, may be comprised of, for example, a doped region, a silicon-based conductive line, a silicon-based gate structure, and the like.

A dielectric layer 14 is formed on the silicon substrate 10 in a conventional manner. The dielectric layer 14 may comprise any suitable material or materials, such as low k dielectric materials or conventional materials such as silicon oxide. The structure of FIG. 1 shows a contact hole 16 that has been formed in the dielectric layer 14. The contact hole 16 has a sidewall 18 and exposes an upper surface 20 of the conductive region portion 12. Conventional techniques for etching the contact hole 16 and forming the conductive region portion 12 may be employed.

Figure 2:
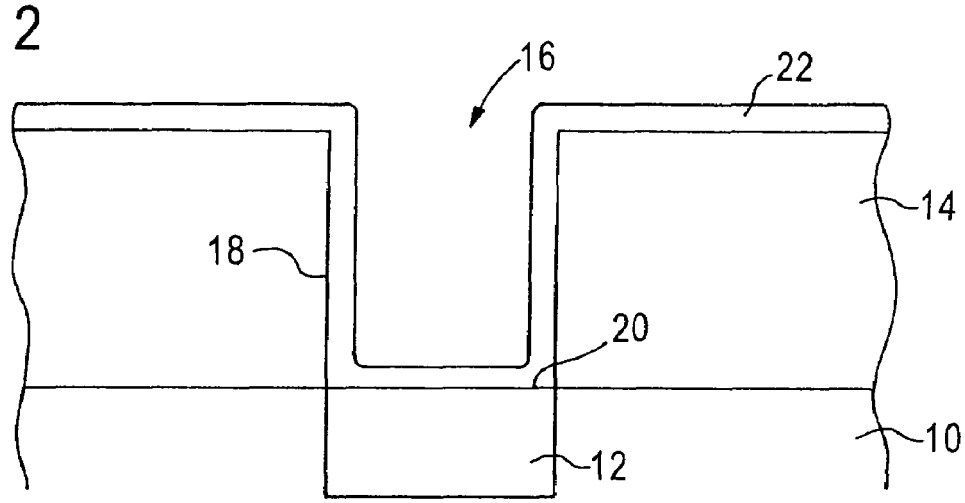
FIG. 2 shows the structure of FIG. 1 following the deposition of a refractory metal contact layer in accordance with embodiments of the present invention.

FIG. 2 shows the structure of FIG. 1 following the deposition of a refractory metal contact layer 22 in accordance with embodiments of the present invention. The refractory metal contact layer 22 may be deposited by any conventional methodology, such as by physical vapor deposition (PVD), for example. In the example of FIG. 2, a conventional deposition temperature is employed during the PVD process. For example, the deposition temperature may be about 250° C. As will be described for other embodiments, however, the deposition temperature may be greater than conventional temperatures in order to form silicide during the deposition of the refractory metal contact layer.

The refractory metal contact layer 22 may consist of titanium, in certain embodiments of the invention. The thickness of the refractory metal contact layer 22 may be less than in conventional contact formation methodologies, since the titanium will not be subject to nitridation caused by exposure to the plasma treatment. For example, in conventional contact methodologies, the nitridation of the titanium in the refractory metal contact layer requires a greater amount (i.e., thicker layer) of titanium on the upper surface 20 of the conductive region portion 12 in order to provide an effective amount of silicide. As a nonlimiting example, conventional methodologies would require approximately 80 to 100 Å of titanium in order to produce 80 to 100 Å of titanium silicide at the conductive region portion. By contrast, the present invention allows a smaller amount of titanium to be provided at the bottom of the contact hole 16, since the titanium will not become nitridated. For example, in certain embodiments of the invention, about 40 to about 50 Å of titanium may be provided at the bottom of the contact hole 16 in order to produce about 80 Å to about 100 Å of silicide in the present invention. In other words, the thickness of the refractory metal contact layer 22 on the conductive region portion 12 has a thickness between about 40% to about 60% of the thickness of the silicide region that will be formed by reacting the refractory metal contact layer 22 with the conductive region portion 12.

By depositing a lesser amount of refractory metal than employed in conventional methodologies, overhang of the contact hole 16 is reduced, as well as saving material consumption. Alternatively, if the same thickness of refractory metal layer 22 is employed as in conventional methodologies, a lower contact resistance will be achieved since the effective thickness of the refractory metal layer 22 is greater in the present invention as it is not subject to a nitridation process.

Figure 3:
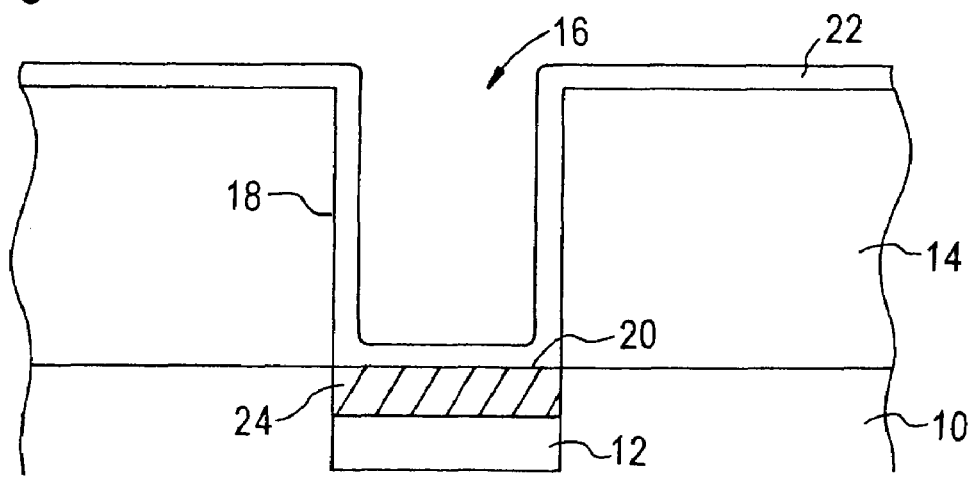
FIG. 3 depicts the structure of FIG. 2 following the formation of silicide at the conductive region, in accordance with embodiments of the present invention.

FIG. 3 depicts the structure of FIG. 2 following formation of a silicide region 24 in accordance with certain embodiments of the invention. In this embodiment, silicide region 24 is formed prior to the formation of the contact barrier metal layer. The silicide region 24 is formed by subjecting the arrangement to an in-situ annealing at high temperatures to cause the refractory metal layer 22 to react with the conductive region portion 12. The wafer being processed may be sent to another chamber, (such as PVD, CVD, degas, etc.) for the in-situ annealing. The temperature needs to be elevated to a temperature that is sufficient to cause the titanium or other refractory metal to form silicide at the conductive region portion 12. For example, the in-situ annealing temperature should be above at least 500° C., and in preferred embodiments, above 600° C. when the refractory metal consists of titanium. In-situ annealing is preferred so as not to contaminate or oxidize the titanium in the refractory metal contact layer 22.

In alternate embodiments, the steps of FIG. 2 and FIG. 3 are combined in a single step such that the refractory metal contact layer 22 is deposited at a sufficiently high temperature so as to react the refractory metal contact layer 22 with the conductive region portion 12 during the deposition of the refractory metal contact layer 22. For example, during deposition of titanium by a PVD process, the deposition temperature may be maintained above 500° C., or preferably above 600° C. This will form the silicide region 24 depicted in FIG. 3, and not require a separate in-situ annealing treatment.

Figure 4:
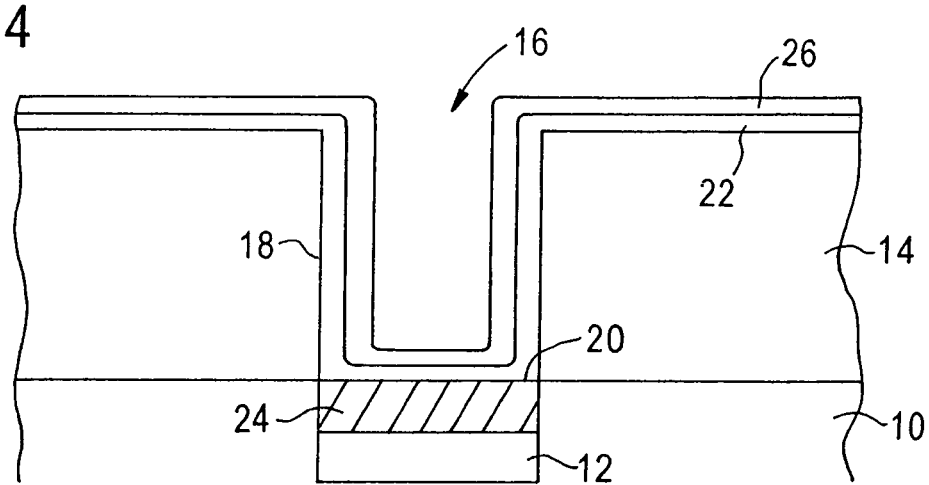
FIG. 4 shows the structure of FIG. 3 after deposition of a contact barrier metal layer, in accordance with embodiments of the present invention.

FIG. 4 shows the structure of FIG. 3 after a contact barrier metal layer 26 has been deposited over the refractory metal contact layer 22. This deposition may be by a MOCVD method, for example, using a precursor such as tetrakis-diemethylamido-titanium (TDMAT) or tetrakis-diethyla-mido-titanium (TDEAT). The material of the contact barrier metal layer 26 is titanium nitride (TiN), for example.

Figure 3A:
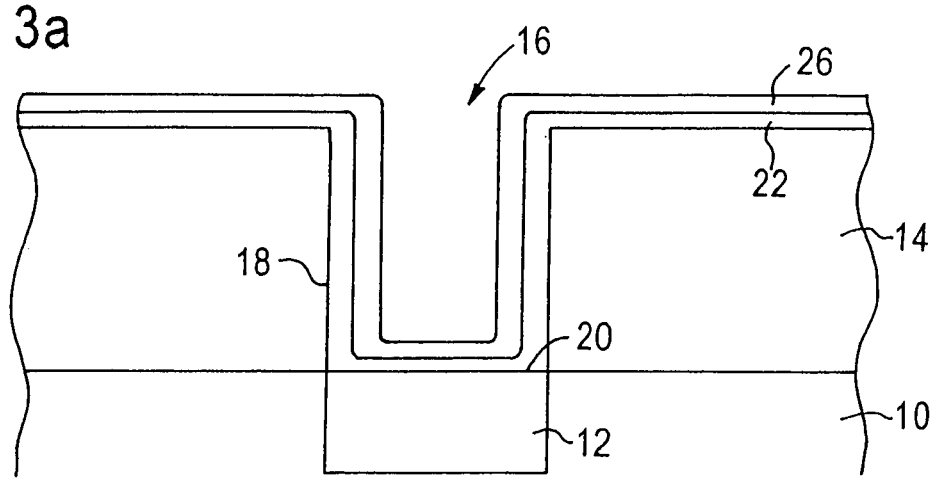
FIG. 3A depicts the structure of FIG. 2, following the deposition of a contact barrier metal layer and prior to the formation of a silicide, in accordance with other embodiments of the present invention.

In alternate embodiments of the invention, depicted in FIG. 3A, the contact barrier metal layer 26 is deposited on the refractory metal contact layer 22 prior to the in-situ annealing to form the silicide region 24. The structure of the contact area after the deposition of the contact barrier metal layer 26 is depicted in FIG. 3A. Following the deposition of the contact barrier metal layer 26, the contact area is subjected to in-situ annealing to form the silicide region 24 by causing the refractory metal contact layer 22 at the bottom of the contact hole 16 to react with the conductive region portion 12, resulting in the structure of FIG. 4. Hence, in alternate embodiments, the in-situ annealing may be performed either before or after the deposition of the contact barrier metal layer 26.

Figure 5:
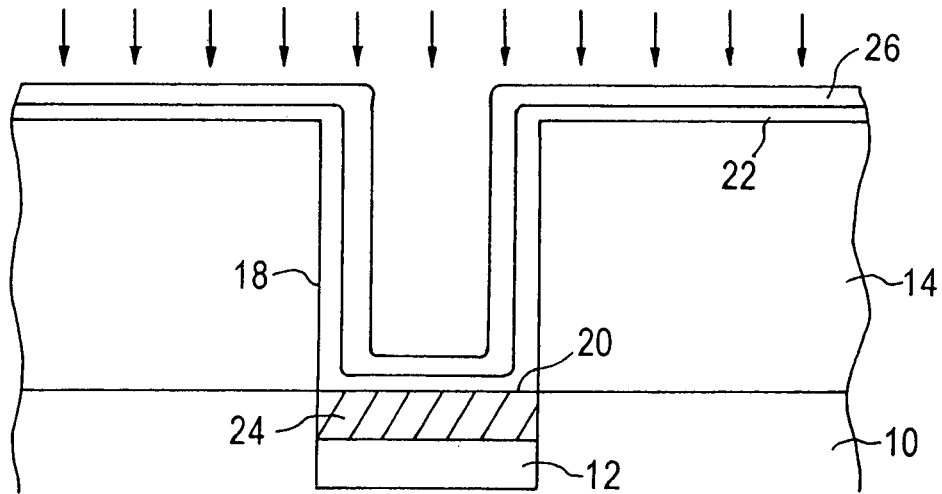
FIG. 5 shows the structure of FIG. 4 following a plasma treatment of the contact barrier metal layer, in accordance with embodiments of the present invention.

FIG. 5 shows the structure of FIG. 4 following a plasma treatment carried out to reduce the contaminants in the contact barrier metal layer 22. Impurities such as carbon and oxides that are normally present in the contact barrier metal layer 22 after deposition may be removed in this manner. The thickness of the contact barrier metal layer 26 is normally reduced by this process. The plasma treatment may comprise a plasma gas containing nitrogen and hydrogen, for example.

Since the plasma treatment of FIG. 5 is performed only after the silicide region 24 has been formed, formation of the silicide is not affected by any nitridation of the titanium or other refractory metal in the refractory metal contact layer 22.

Figure 6:
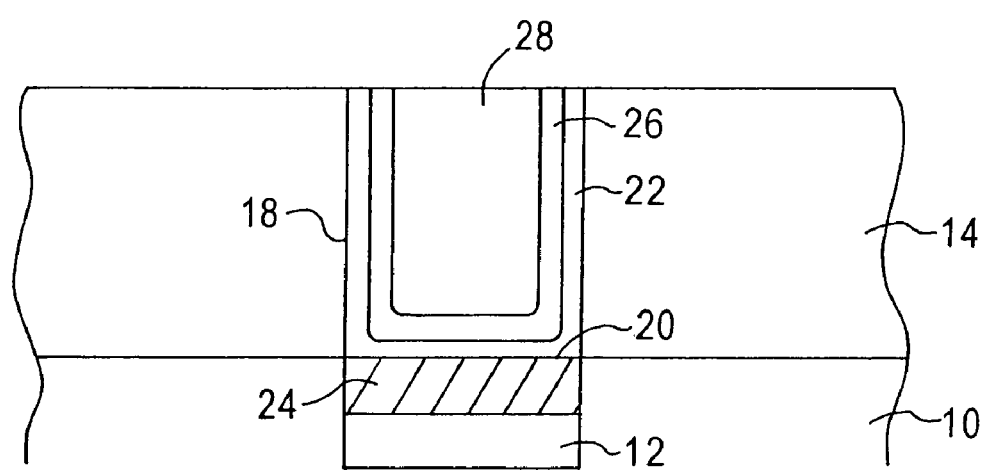
FIG. 6 shows the structure of FIG. 5 after the formation of a contact plug, in accordance with embodiments of the present invention.

Following the plasma treatment, a contact metal deposition to form the contact plug 28 may be performed. This deposition of the contact metal is followed by a metal chemical-mechanical polishing, for example to form the completed contact 28, as depicted in FIG. 6. Any suitable contact material may be employed to form the contact 28, such as aluminum, tungsten, copper, etc.

The present invention thus provides an improved method for forming a contact in a semiconductor device which avoids nitridation of the contact metal until at least after the silicide to the contact or conductive region is created. This is achieved by forming the silicide prior to a plasma treatment of the contact barrier metal layer.

Although the present invention has been described and illustrated in detail, it is to be clearly understood that the same is by way of illustration and example only, and is not to be taken by way of limitation, the scope of the present invention being limited only by the terms of the appended claims.

What is claimed is:

1. A method of forming a contact in a semiconductor device, comprising the steps:
   forming a silicon substrate with a conductive region;
   forming a dielectric layer on the silicon substrate and a contact hole in the dielectric layer exposing at least a portion of the conductive region;
   depositing a refractory metal contact layer in the contact hole and on the conductive region portion;
   forming a silicide region by reacting the refractory metal contact layer with the conductive region portion without exposure of the refractory metal contact layer or the silicide region to plasma;
   forming a contact barrier metal layer on one of the refractory metal contact layer or the silicide region; and
   plasma treating the contact barrier metal layer only after the forming of the silicide region.

2. The method of claim 1, wherein the refractory metal contact layer consists of titanium (Ti).

3. The method of claim 2, wherein the contact barrier metal layer consists of titanium nitride (TiN).

4. The method of claim 3, wherein the step of depositing a refractory metal contact layer and the step of forming a silicide region includes depositing the titanium at a temperature sufficient to cause the titanium to react with the conductive region portion to form silicide at the conductive region portion.

5. The method of claim 4, wherein the temperature is above 500° C.

6. The method of claim 4, wherein the temperature is above 600° C.

7. The method of claim 3, wherein the step of forming a silicide region includes performing an in-situ anneal at a temperature sufficient to cause the titanium to react with the conductive region portion to form silicide at the conductive region portion.

8. The method of claim 7, wherein the temperature is greater than 500° C.

9. The method of claim 7, wherein the temperature is greater than 600° C.

10. The method of claim 3, wherein the refractory metal contact layer is deposited to a thickness on the conductive region portion between about 40% to about 60% of a thickness of the silicide region formed by reacting the refractory metal contact layer with the conductive region portion.

11. The method of claim 3, wherein the step of depositing a refractory metal contact layer includes physical vapor deposition of the refractory metal contact layer.

12. The method of claim 11, wherein the step of forming a contact barrier metal layer includes metal organic chemical vapor deposition (MOCVD) of the contact barrier metal layer.

13. The method of claim 1, wherein the step of forming a contact barrier metal layer is performed prior to the step of forming a silicide region.

14. The method of claim 1, wherein the step of forming a contact barrier metal layer is performed after the step of forming a silicide region and before the step of plasma treating the contact barrier metal layer.

15. A method of forming a contact, comprising the steps:
   depositing a refractory metal contact layer within a contact hole formed in a dielectric layer on a silicon substrate having a contact region exposed by the contact hole;
   forming a contact barrier metal layer on the refractory metal contact layer without plasma treatment;

forming silicide at the contact region without exposure to plasma; and plasma treating the contact barrier metal layer after the forming of the silicide.

16. The method of claim 15, wherein the refractory metal contact layer consists of titanium and the contact barrier metal layer consists of titanium nitride.

17. The method of claim 16, wherein the silicide is formed with a thickness of x, and the refractory metal contact layer is deposited to a thickness on the contact region of between about 0.4x to about 0.6x.

18. The method of claim 17, wherein the depositing of the refractory metal contact layer and the forming of silicide at the contact region are performed simultaneously by depositing the refractory metal contact layer at a temperature sufficient to cause the titanium to react with the contact region.

19. The method of claim 18, wherein the method of forming silicide includes in-situ annealing after the depositing of the refractory metal contact layer, at an annealing temperature sufficient to cause the titanium to react with the contact region.

* * * * *